(12) United States Patent
Ni et al.

(10) Patent No.: US 7,541,904 B2
(45) Date of Patent: Jun. 2, 2009

(54) MAGNETIC FIELD ADJUSTING DEVICE

(75) Inventors: Cheng Ni, Shenzhen (CN); Ting Qiang Xue, Shenzhen (CN); Jin Jun Chen, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/591,639

(22) PCT Filed: Mar. 7, 2005

(86) PCT No.: PCT/EP2005/003084

§ 371 (c)(1),
(2), (4) Date: Jun. 13, 2007

(87) PCT Pub. No.: WO2005/091007

PCT Pub. Date: Sep. 29, 2005

(65) Prior Publication Data

US 2007/0257758 A1   Nov. 8, 2007

(30) Foreign Application Priority Data

Mar. 5, 2004   (CN) .............. 2004 1 00061745

(51) Int. Cl.
*H01F 1/00* (2006.01)
*H01F 6/00* (2006.01)
*H01F 7/00* (2006.01)
(52) U.S. Cl. ..................... 335/216; 335/301
(58) Field of Classification Search ......... 335/296–306; 324/318–320
See application file for complete search history.

(56) References Cited

U.S. PATENT DOCUMENTS 3,241,198 A  *  3/1966  Baermann .................. 49/478.1

(Continued)

FOREIGN PATENT DOCUMENTS

CN         1385134        12/2002

(Continued)

*Primary Examiner*—Elvin G Enad
*Assistant Examiner*—Alexander Talpalatskiy
(74) *Attorney, Agent, or Firm*—Crowell & Moring LLP

(57) ABSTRACT

The present invention relates to a magnetic field adjusting device; such as may be used in MRI apparatus. The device can overcome the magnetic force to enable shimming plugs to move in a controlled continuous manner, thereby achieving continuous adjusting and accurate positioning. The magnetic field adjusting device comprises; a pair of opposing pole plates (3, 31), respectively mounted on magnetic field generating sources, forming a magnetic field space; a plurality of shimming plugs (42) movably mounted at the periphery of said pole plates (3, 31), each shimming plug (42) mounted in a radially oriented retaining groove (45), so as to be movable in the direction of the retaining groove. Additionally, or alternatively, the circumferences of the magnetic field generating sources (5, 51) are arranged with adjusting bars (71, 81) which can move perpendicular to the pole plates. As an advantage of the present invention, the magnetic field can be shimmed conveniently quickly, and accurately to improve the imaging quality.

9 Claims, 7 Drawing Sheets

U.S. PATENT DOCUMENTS

| | | | | |
|---|---|---|---|---|
| 4,639,673 A * | 1/1987 | Zijlstra | | 324/319 |
| 4,672,346 A * | 6/1987 | Miyamoto et al. | | 335/296 |
| 4,698,611 A * | 10/1987 | Vermilyea | | 335/298 |
| 4,812,765 A * | 3/1989 | Aubert | | 324/320 |
| 4,937,545 A * | 6/1990 | Chaillout et al. | | 335/298 |
| 4,943,774 A * | 7/1990 | Breneman et al. | | 324/318 |
| 4,944,356 A * | 7/1990 | Oslapas | | 180/400 |
| 5,003,276 A * | 3/1991 | Sarwinski et al. | | 335/304 |
| 5,045,794 A * | 9/1991 | Dorri et al. | | 324/320 |
| 5,168,231 A * | 12/1992 | Aubert | | 324/320 |
| 5,194,810 A | 3/1993 | Breneman et al. | | |
| 5,343,183 A * | 8/1994 | Shimada et al. | | 335/301 |
| 5,463,363 A * | 10/1995 | Ogawa | | 335/299 |
| 5,474,520 A * | 12/1995 | Bittikofer | | 601/27 |
| 6,311,832 B1 * | 11/2001 | Kwasniewicz et al. | | 198/619 |
| 6,448,772 B1 * | 9/2002 | Aoki | | 324/307 |
| 6,529,005 B1 * | 3/2003 | Kasten et al. | | 324/320 |
| 6,586,936 B2 * | 7/2003 | Pittaluga et al. | | 324/319 |
| 6,700,378 B2 * | 3/2004 | Sato | | 324/318 |
| 6,747,537 B1 * | 6/2004 | Mosteller | | 335/306 |
| 2002/0167320 A1 | 11/2002 | Sato | | |
| 2003/0234623 A1* | 12/2003 | Douglas | | 318/254 |
| 2007/0069731 A1* | 3/2007 | Ni et al. | | 324/320 |

FOREIGN PATENT DOCUMENTS

| | | |
|---|---|---|
| EP | 0 619 499 A | 10/1994 |
| EP | 1 154 280 A | 11/2001 |
| EP | 1 260 827 A | 11/2002 |
| GB | 2 319 339 A | 5/1998 |

* cited by examiner

MAGNETIC FIELD ADJUSTING DEVICE

TECHNICAL FIELD

The present invention relates to a magnetic field adjusting device for magnetic apparatus, particularly to a mechanical shimming device for improving the homogeneity of a magnetic field of Magnetic Resonance Imaging (MRI) apparatus, thereby to improve the imaging quality.

BACKGROUND ART

Magnetic fields are widely used in various measuring and imaging technologies, for example, in various kinds of MRI apparatus. In some examples, permanent magnetic fields generated by permanent magnets are employed.

FIG. 1 shows a magnetic arrangement employing C-shaped permanent magnet. The arrangement may be employed in an open MRI apparatus. The magnetic arrangement comprises a C-shaped frame 1 serving as a yoke; upper press plate 2 and lower press plate 21 respectively mounted on the upper and lower ends of an opening of the C-shaped frame, opposing upper pole plate 3 and lower pole plate 31 arranged in the opening of the C-shaped frame; Ring-shaped parts (Rose-ring) 4 and 40 respectively mounted on the opposing surfaces of the upper pole plate 3 and lower pole plate 31; an upper gradient coil and a lower gradient coil (not shown) respectively mounted parallel to the upper pole plate 3 and parallel to lower pole plate 31, and arranged within the respective Rose-rings. An upper magnetic field generating source 5 is arranged between the upper press plate 2 and upper pole plate 3, and a similar lower magnetic field generating source 51 is arranged between the lower press plate 21 and lower pole plate 31. Each magnetic field generating source 5, 51 is composed of a plurality of permanent magnets.

The above magnetic field generating sources 5, 51 are important components of some MRI apparatus. For example, such magnetic field generating devices may be mounted between the press plates 2, 21 and pole plates 3, 31 arranged in the opening of open MRI apparatus, to generate magnetic field strength up to 0.5 Tesla for a whole body MRI apparatus, or up to 1 Tesla for parts of body or animal or industrial MRI apparatus. The homogeneity of the resultant magnetic field is very important to the imaging quality. Generally, the magnetic field is stronger in a central area close to the upper and lower pole plates, 3, 31, but is weaker at the periphery of the pole plates. In order to improve the homogeneity of magnetic field in the space between the upper and lower pole plates, rose-rings 4, 40 are respectively mounted at the periphery of the upper and lower pole plates 3, 31. Because the rose-rings 4, 40 protrude from the surfaces of the upper and lower pole plates 3, 31, the magnetic field strength at the periphery of the pole plates is partially intensified to improve the homogeneity of the overall magnetic field. This improves the homogeneity of magnetic field between the upper and lower pole plates, which is advantageous for imaging purpose. Before a permanent magnet MRI apparatus is dispatched, the magnetic field between the upper and lower pole plates must be adjusted to a homogeneous state, which can be verified with an imaging process.

However, during the course of transportation, installation and operation of the MRI apparatus, the homogeneity of the magnetic field between the upper and lower pole plates 3, 31 will be degraded by environmental changes such as changes of environmental temperature and surrounding magnetic environment. Consequently, it is necessary to re-shim the magnetic field at the operational site to obtain homogeneous magnetic field, and so to allow imaging of the desired quality.

U.S. Pat. No. 4,943,774 discloses a magnetic field adjusting device as shown in FIG. 2. The rose-ring is composed of annular ring 56 and sixteen pieces of movable shim plates 60 mounted thereon. Each shim plate 60 defines two slots 64, and is fixed onto the ring 56 by means of two screws 66 extending through the slots 64. When the magnetic field is to be adjusted ("shimmed"), screws 66 are loosened and the shim plates 60, are moved radially inwards or outwards. The slots 64 slide past screws 66. Once a shim plate is in position, its screws 66 are retightened to hold the shim plate in position. Additionally, to achieve increased homogeneity, one or more of the shim plates can be laminated. The shim plates may comprise a stack of laminations, so that the homogeneity can be achieved by adding or taking out some of the laminations. Limitations of such mechanical homogeneity improving method include the following. A considerable external force is needed to move the shim plates, since the shim plates are strongly attracted to the magnetic field generating source. Friction between the shim plates and the surface means that the shim plate will need to be pushed hard to move at all. Under such a strong force, it is difficult to accurately locate the shim plate in the required position. It is very difficult to accurately control the moving distance or to replace the shimming plug in its original position, as the described screw fasteners 66 do not offer an accurate positioning. It is difficult to measure the displacement imparted to a shim plate, or to be sure that one has replaced a shim plate in its original position. The assembly and disassembly of such structure demands considerable time and man-power, which dramatically increases the cost of installation. The adjusting operation can only be performed on the top layer; and the adjusting range is very limited. The means of disassembling the shim plates or stacked layers of laminations can not realize continuous adjustment. A special disassembling device is needed, which also demands considerable time and man-power, which dramatically increases the cost thereof.

CONTENT OF THE INVENTION

The primary objective of the present invention is to provide a magnetic field adjusting device, which can overcome external magnetic force to move a shim, thereby achieving continuous adjusting and accurate positioning of the shim.

Accordingly, the present invention provides a magnetic field adjusting device for mounting on a pole plate mounted on a magnetic field generating source, the magnetic field adjusting device comprising a plurality of movable shimming plugs. Each of the shimming plugs is mounted in a retaining groove, whereby each shimming plug can only move in the direction of the retaining groove.

The retaining grooves may be swallow-tailed grooves, and said shimming plugs may have a trapezoidal section, for engaging with and sliding in the swallow-tailed retaining grooves. Alternatively, the retaining grooves may be T-shaped grooves, and said shimming plugs may have a T-shaped section, for engaging with and sliding in the T-shaped retaining grooves.

The shimming plug may be driven by means of a drive screw.

The shimming plugs may be dismountable for replacement with shimming plugs of different size or different magnetic properties.

In use, the shimming plugs may be mounted at the periphery of a pole plate and each retaining groove may be oriented in a substantially radial direction of said pole plate.

The present invention also provides an assembly comprising a pole plate and a magnetic field adjusting device as described, wherein the periphery of the pole plate is mounted with a ring-shaped part, and said retaining grooves are formed in the ring-shaped part. In a certain embodiment, there are twelve retaining grooves evenly distributed around the ring-shaped part.

The present invention also provides a magnetic field generating source provided with a magnetic field adjusting device, wherein the magnetic field adjusting device comprises adjusting bars mounted at the periphery of the magnetic field generating source, the adjusting bars being movable in a direction substantially parallel to a magnetic field produced by the magnetic field generating source.

The may further be provided with a pole plate mounted on the magnetic field generating source, wherein the adjusting bars are movable in a direction perpendicular to the pole plate.

The adjusting bars may be mounted movably in retaining means.

The retaining means may be arranged at the periphery of the magnetic field generating source. The retaining means may be arranged at the periphery of the pole plate.

The adjusting bars may have a rack structure, and are arranged to be driven by means of mating pinion gears.

The adjusting bars may be in the form of screws, which can be driven through an internal thread formed in the retaining means.

The adjusting bars may be dismountable for replacement with adjusting bars of different size or different magnetic properties.

The shimming plugs or adjusting bars may be arranged for adjustment in a synchronized manner.

The shimming plugs or adjusting bars may be arranged for remote adjustment by one or more electric motor.

The magnetic field adjusting device or magnetic field generating source may further comprise a computer programmed with magnetic field measurement and/or modeling software, the computer being arranged to control the electric motors to adjust the shimming plugs or adjusting bars in accordance with instructions provided in response to magnetic field measurement or modeling.

The computer may be arranged to control the electric motors to automatically adjust the shimming plugs or adjusting bars to achieve a desired level of field homogeneity.

The present invention also provides a magnetic field generation device comprising a pair of opposing magnetic field generating sources as described, arranged to provide a magnetic field generated between them.

The present invention also provides a magnetic field generation device comprising a pair of opposing magnetic field generating sources arranged to provide a magnetic field between them; a pair of pole plates, respectively mounted on the opposing faces of the magnetic field generating sources, and at least one magnetic field adjusting device as described.

The present invention also provides a magnetic field generation device comprising a yoke, connected with an upper press plate and a lower press plate, the lower press plate and the upper press plate oppositely arranged; and a magnetic field generating device as described, with respective magnetic field generating sources and pole plates oppositely mounted on respective said press plates.

The present invention also provides MRI apparatus comprising a magnetic field generation device as described.

The present invention also provides the following solution: a magnetic field adjusting device for MRI apparatus, comprising: a yoke, connected with an upper press plate and a lower press plate, the lower press plate and the upper press plate oppositely arranged; a pair of magnetic field generating source, respectively and oppositely mounted on said upper press plate and lower plate, and a magnetic field generated between the two magnetic field generating sources; a pair of pole plates, upper pole plate mounted on the magnetic field generating source, lower pole plate mounted on magnetic field generating source, and a magnetic field space formed between the magnetic field generating source; a plurality of movable shimming plugs mounted at the periphery of said upper pole plate and lower pole plate; which characterized in: each of the above shimming plugs is mounted in a lead groove, and the plug can only move in the guided direction of the lead groove.

Furthermore, in accordance with a preferred embodiment of the present invention, the peripheries of the upper pole plate and lower pole plate are respectively mounted with ring-shaped parts, and said lead groove is formed in the ring-shaped part. Said lead groove is substantially formed in radial direction of said ring-shaped part. There are twelve said lead grooves evenly distributed on said ring-shaped parts.

In accordance with another preferred embodiment of the present invention, said lead groove is swallow-tailed groove, and said shimming plug has a trapezoidal section, for engaging with and sliding in the swallow-tailed groove. Said shimming plug is driven by means of a lead screw.

In accordance with an alternative preferred embodiment of the present invention, said lead groove is a T-shaped groove, and said shimming plugs has a T-shaped section, for engaging with and sliding in the swallow-tailed groove. Said shimming plug is driven by means of a lead screw.

The above objective can be achieved by the following alternative solution: a magnetic field adjusting device for MRI apparatus, comprising: a yoke, connected with an upper press plate and a lower press plate, the lower press plate and the upper press plate oppositely arranged; a pair of magnetic field generating source, respectively and oppositely mounted on said upper press plate and lower plate, and a magnetic field generated between the two magnetic field generating sources; a pair of pole plates, upper pole plate mounted on the magnetic field generating source, lower pole plate mounted on magnetic field generating source, and a magnetic field space formed between the magnetic field generating source; ring-shaped parts mounted at the periphery of the upper pole plates and lower pole plate; which characterized in: adjusting bars which can be moved up and down are mounted at the periphery of the magnetic field generating source.

In accordance with a preferred embodiment of the present invention, said adjusting bars are mounted movably in lead means. Said lead means are arranged at the periphery of the press plates and/or the pole plates.

In accordance with another preferred embodiment of the present invention, said adjusting bars have a rack structure, and can be driven by means of gears separately or in a synchronized manner.

In accordance with another preferred embodiment of the present invention, said adjust bars are screws, which can be driven through the internal thread formed in the lead means.

In accordance with another preferred embodiment of the present invention, said adjust bars can be dismounted and replaced with adjusting bars of different size.

DESCRIPTION OF FIGURES

The figures included herein provide a further understanding of the invention. A brief description of the figures is as follows.

EMBODIMENTS

Figure 1:
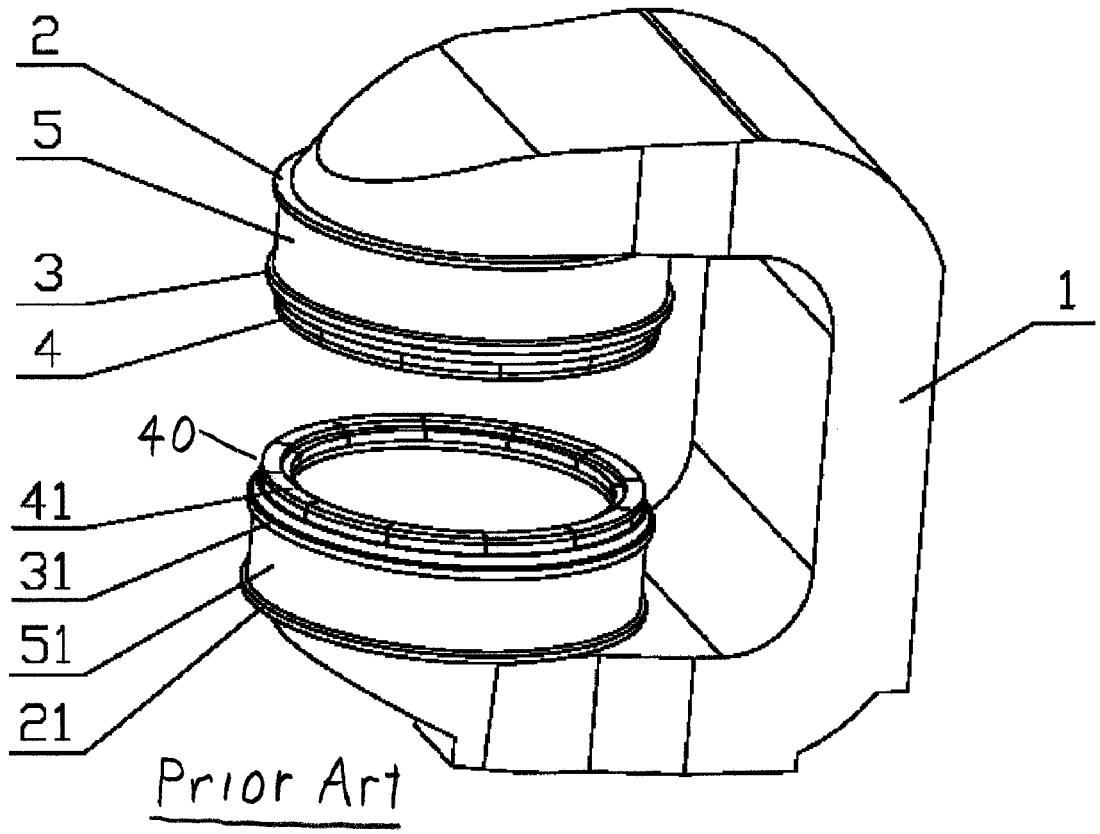
FIG. 1 is an isometric view showing a general structure of conventional MRI apparatus.
Figure 3:
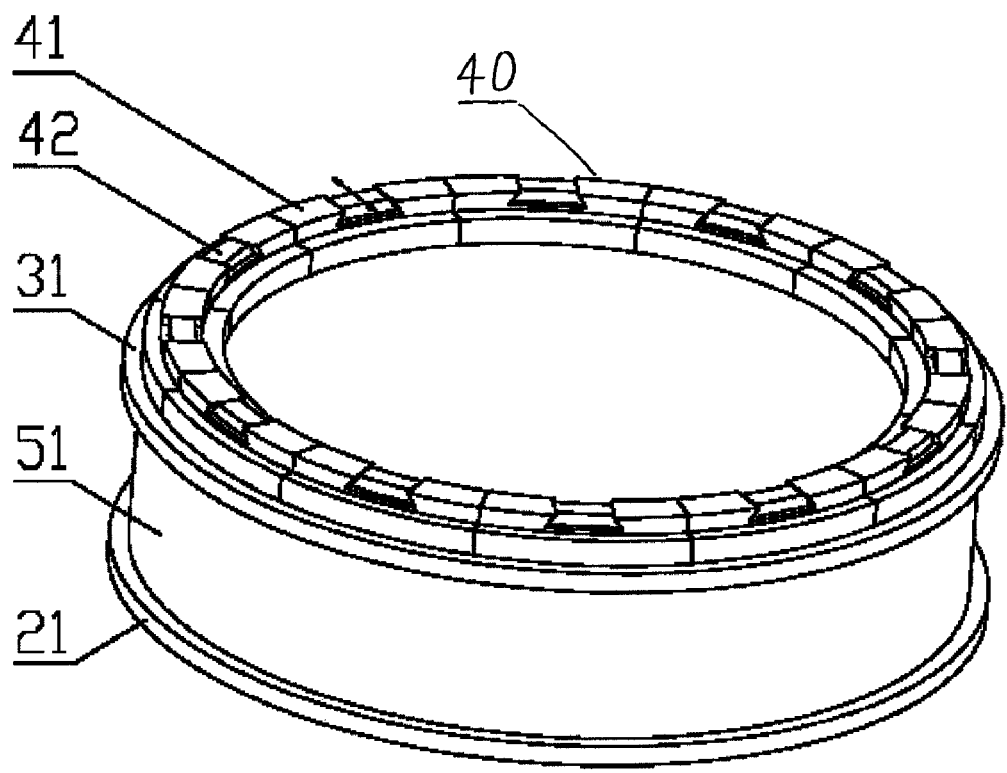
FIG. 3 is an isometric view of an adjusting device in accordance with a preferred embodiment of the magnetic field adjusting device of the present invention, wherein suitably shaped shimming plugs are mounted in swallow-tailed grooves.
Figure 4A:
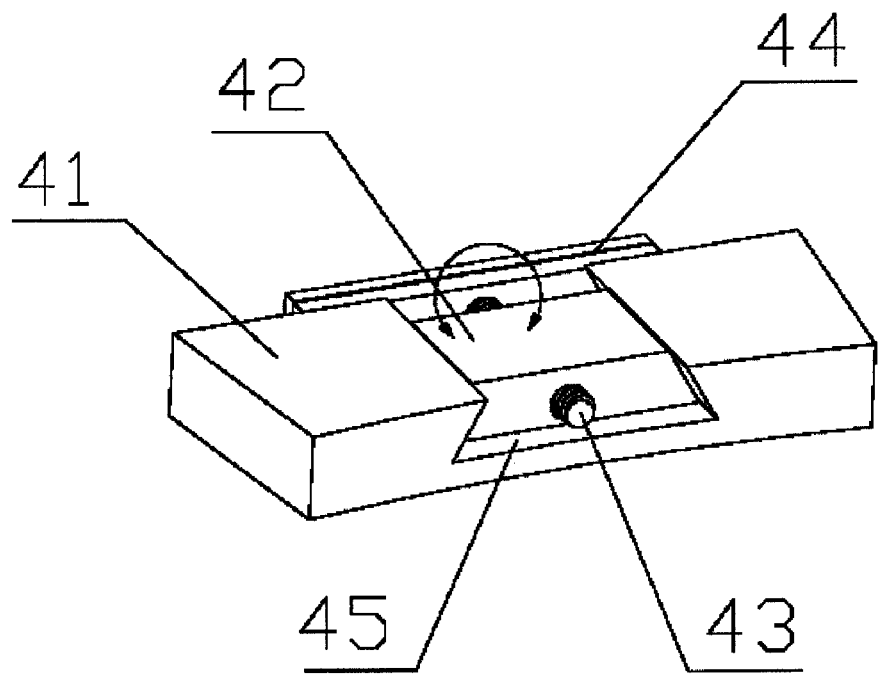
FIG. 4A is an isometric, partial enlargement view of the embodiment of FIG. 3, showing the shimming plug driven inwards and outwards inside the swallow-tailed groove by a drive screw.

FIGS. 3 and 4A illustrate a magnetic field adjusting device of the present embodiment, and its application to a known magnet arrangement, such as is shown in FIG. 1.

FIG. 1 shows a known magnet arrangement which may be adapted according to the present invention. As shown in FIG. 1, the magnetic arrangement comprises: a C-shaped yoke 1, which may serve as the frame of an MRI apparatus. The yoke 1 connects opposing upper 2 and lower 21 press plates. A pair of magnetic field generating sources 5, 51 are respectively and oppositely mounted on the upper press plate 2 and lower press plate 21, so that a magnetic field is formed between the two magnetic field generating sources. The magnetic field generating sources may be permanent magnets. An upper pole plate 3 is mounted on the downward surface of the upper magnetic field generating source 5, and a lower pole plate 31 is mounted on the upward surface of the lower magnetic field generating source 51, thus defining a magnetic field space between the pole plates. Peripheral ring-shaped parts (herein referred to as rose-rings) 4, 40 are respectively mounted at the periphery of the opposing surfaces of the upper and lower pole plates 3, 31. The ring-shaped parts 4, 40 protrude from the periphery of the pole plates 3, 31, and serve to strengthen the magnetic field intensity at the periphery of the pole plates 3, 31, thus improving the homogeneity of magnetic field in central volume between the pole plates 3, 31 and at the peripheral portions of the pole plates 3, 31. The ring-shaped parts 4, 40 are generally made of a soft magnetic material.

FIG. 3 illustrates, as an example, the lower magnetic field generating source 51 on the lower press plate 21, lower pole plate 31 and the ring-shaped part 40 at the periphery thereof.

Said ring-shaped part 40 comprises a plurality, for example twelve, of sector segments 41 which connect with each other to form ring-shaped part 40. Each of the segments 41 incorporates a retaining groove 45 (FIG. 4A) along the radial direction of the ring-shaped part 40. A shimming plug 42 is placed within each retaining groove, so as to be movably retained within the retaining groove. In this embodiment there are twelve retaining grooves 45 and twelve shimming plugs 42, distributed evenly about the ring-shaped part 40. Of course, the number of retaining grooves 45 and shimming plugs 42 can be varied according to requirement, and can also be distributed asymmetrically. In an embodiment such as illustrated in FIG. 1, similar modifications may be made to the upper magnetic field generating source 5.

FIG. 4A shows an enlarged view of a single sector segment 41 of the ring-shaped part 41 of FIG. 3. In the illustrated embodiment, the retaining groove 45 on the sector segment 41 is a swallow-tailed groove, and the shimming plug 42 has a mating trapezoidal cross-section which is located in sliding engagement into the 20 swallow-tailed groove 45. The swallow-tailed groove restricts the movement of the shimming plug 42 to the radial direction only. The shimming plugs 42 can not move in any other direction other than the radial direction even under strong magnetic force. In order to retain, and move, the shimming plug 42 while under the influence of a strong magnetic force, and to secure its position, there is provided a threaded hole in the said shimming plug 42, and a drive screw 43 mounted on clamp plates 44. The drive screw 43 is engaged in, and extends through, the threaded hole of the shimming plug 42. The clamp plates 44 are fixedly mounted on an outer side of the sector segment 41. The shimming plug 42 can be accurately driven radially inward and outward by turning the lead screw 43 clockwise or counter clockwise, even in the presence of a strong magnetic field. The shimming plug can be accurately positioned and returned to its original position if necessary by taking advantage of the self-locking effect of lead screw 43. The magnetic field in the corresponding region can be increased or reduced by such shimming action, so that magnetic field can be adjusted to achieve a required degree of homogeneity.

Figure 4B:
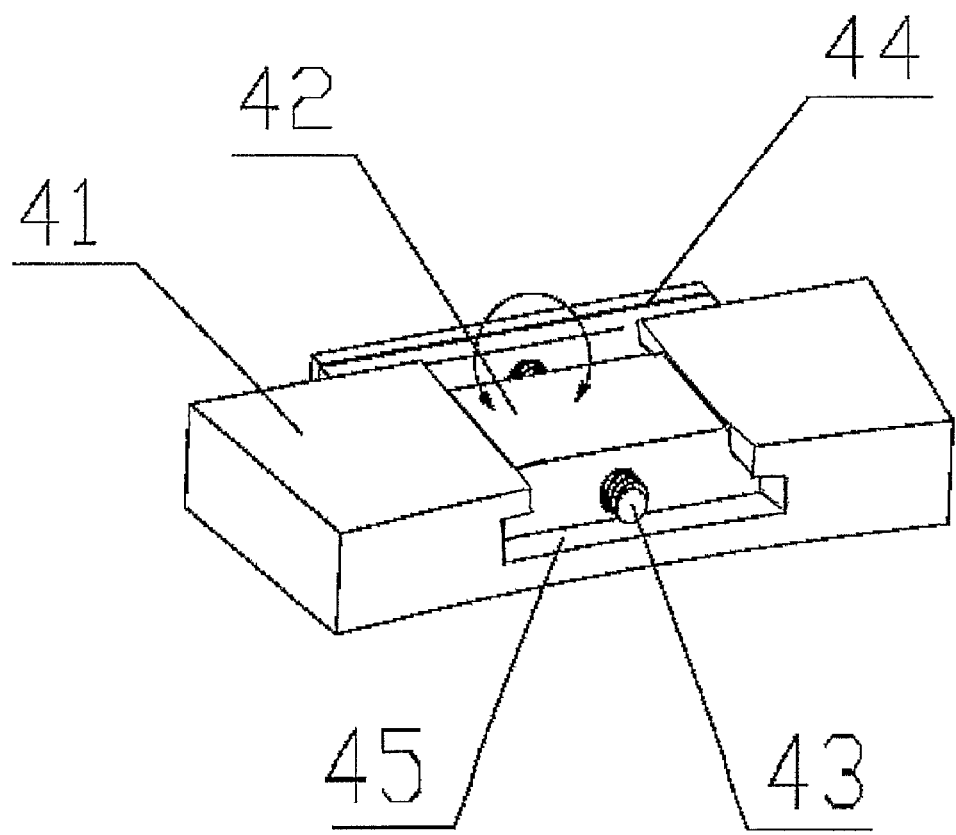
FIG. 4B is a view, similar to that of FIG. 4A, of another embodiment of the present invention, where a T-shaped shimming plug is driven within a T-shaped groove.

FIG. 4B shows another embodiment of the present invention. In this embodiment, the magnetic field adjusting device has a similar structure to the first embodiment, as shown in FIGS. 3 and 4A, except that the retaining groove of the ring-shaped part 40 is a T-shaped groove, and the cross-section of the shimming plug 42 is also T-shaped, to fit accurately in sliding engagement within the groove. The remaining technical features are the same as those of the embodiment of FIG. 4A Because the upper ring-shaped part 4 has the same structure as the lower ring-shaped part 40 illustrated in FIGS. 3 and 4A or 4B, it is not further described in detail.

The shimming plugs may be individually removed and replaced with shimming plugs of a different size or different magnetic properties, to provide the required field adjusting effect. Each shimming plug may comprise stacked laminations, which may be of differing thicknesses, and which may be individually adjusted or removed.

Figure 2:
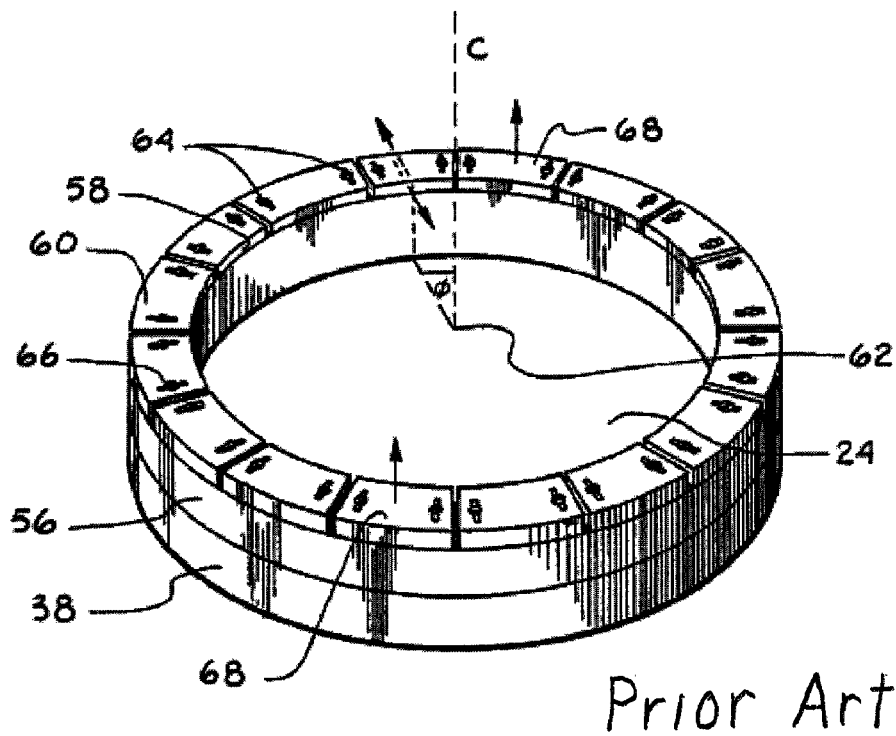
FIG. 2 is an isometric view showing a conventional mechanical magnetic field adjusting device for the magnetic field of conventional MRI apparatus, wherein shim plates are secured on the top surface of an annular ring by screws.

The magnetic field adjusting device of the present invention provides at least the following advantages: firstly, while the shim plates of the prior art shown in FIG. 2 are difficult to move at all under the strong magnetic force, and extremely difficult to move with accuracy, the present invention makes use of a retaining groove 45, and drive screw 43, to provide shimming plugs 42 which can be moved, positioned accurately and easily in a continuous manner, so that the adjusting of magnetic field becomes very convenient and simplified.

The use of a drive screw and preferably also an interference fit of the shimming plug 42 within the retaining groove 45 means that the shimming plug is securely held in position when it is not being moved. This may be referred to as the self-locking mechanism. Alternatively, a specific mechanical or other self-locking mechanism, known in itself, may be provided to retain the drive screw in position when it is not being driven. The present invention makes it possible to adjust the magnetic field with high accuracy and efficiency. In the illustrated embodiments, the retaining grooves and so the movement of the shimming plugs, are arranged in a radial direction the main axis of the magnetic field. Other orientations of the retaining grooves are of course possible within the scope of the present invention.

In some embodiments the ring-shaped parts 4, 40 may be formed of a plurality of layers. In such embodiments a retaining groove, drive screw and self-locking mechanism of the present invention may be provided in two or more of the layers. Measurement of the field change caused by movement of the shimming plugs, can be easily predicted by modeling and azimuth.

Figure 5:
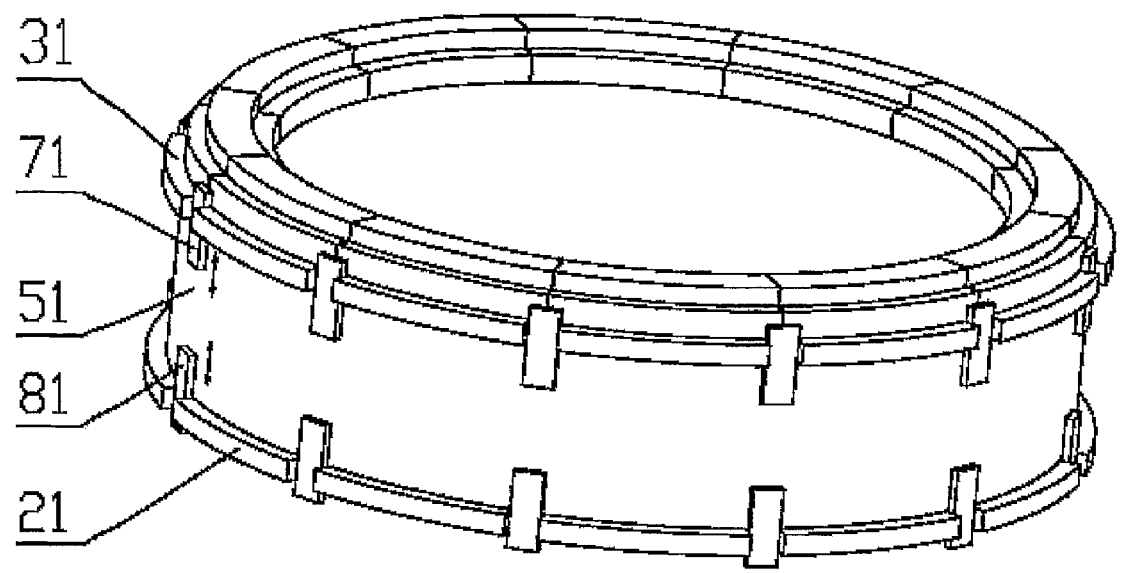
FIG. 5 is an isometric view of a shimming arrangement in accordance with an alternative embodiment of the present invention, wherein adjusting bars are mounted at the periphery of a magnetic field generating source.
Figure 6:
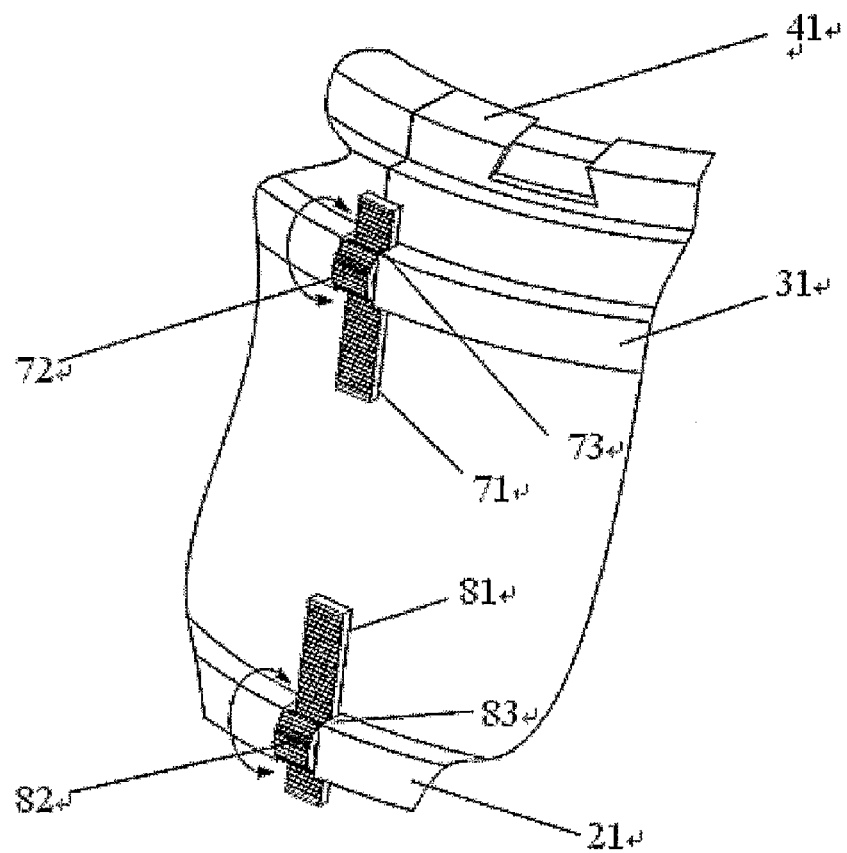
FIG. 6 is an isometric, partial enlargement view of the preferred embodiment of FIG. 5, showing the adjusting bar driven in guiding rails.

FIGS. 5 and 6 illustrate another embodiment of the present invention.

FIG. 5 illustrates the lower press plate 21 and lower pole plate 31, and lower magnetic field generating source 51 is mounted between them. A plurality of adjusting bars 71, 81 are movably mounted at the periphery of the magnetic field generating source 51. The adjusting bars are preferably slidably mounted in retaining means (73, 83). The adjusting bars 71, 81 are preferably of a soft magnetic material. When said adjusting bars 71, 81 are moved in a direction perpendicular to the pole plate on the circumference of the magnetic field generating source 51, a corresponding portion of the magnetic field will effectively be short circuited. The magnetic field is thereby adjusted to improve the homogeneity of magnetic field at the periphery of the magnetic field generating source 51 by using such effect of magnetic short circuiting. The cross section of the adjusting bars 71, 81 can be of any suitable shape, such as rectangular, trapezoidal, arc-shaped and the like, the thickness of the adjusting bars 71, 81 can be defined according to the requirement of the dimension of the magnet, and the width of the adjusting bars 71, 81 may be defined according to the required adjusting range of magnetic field. A magnetic field adjusting effect can be accordingly provided without enlarging the magnet pole size.

As illustrated in FIG. 6, at least one retaining means 73 suitable for accommodating the adjusting bar 71 is provided at the periphery of the lower pole plate 31. At least one retaining means 83 suitable for accommodating adjusting bar 81 is provided at the periphery of the lower press plate 21. The adjusting bars 71, 81 are mounted in said retaining means 73, 83, and are thereby guided to be movable perpendicular to the press plate 21 while being retained within retaining means 73, 83. The retaining means ensure that the adjusting bars 71, 81 may move accurately in the guided direction even under the influence of a strong magnetic force. To overcome the magnetic force and to drive the adjusting bars, the adjusting bars 71, 81 are preferably designed as a rack and can be driven up and down by mating pinion gears 72, 82. The adjusting bars may be adjusted separately or in a synchronized manner. In the present embodiment, a plurality of adjusting bars 71, 81 is mounted at the respective peripheries of both the lower press plate 21 and the lower pole plate 31. It may be found beneficial to arrange the adjusting bars 71 and 81 in pairs vertically to gain an efficient adjusting effect to shim the overall magnetic field.

Only the lower magnetic field generating source 51 of the MRI apparatus is shown as an example in FIGS. 5 and 6, which describes the magnetic field adjusting device using adjusting bars 71, 81. The structure of the adjusting bars in the upper magnetic field generating source 5 is preferably symmetrical to that of shown in FIGS. 5 and 6, having the exact same structure and so will not be described in detail.

The adjusting bars of the present invention can be adjusted accurately in the restricted direction to change the magnetic field strength at the periphery of the magnetic field sources 5, 51. The adjusting bars are mounted and retained by retaining means 73, 72, 83, 82 and can be arranged on the outer periphery of the pole plate and press plate to gain the maximum field adjusting effect without enlarging the magnet pole size.

Figure 8:
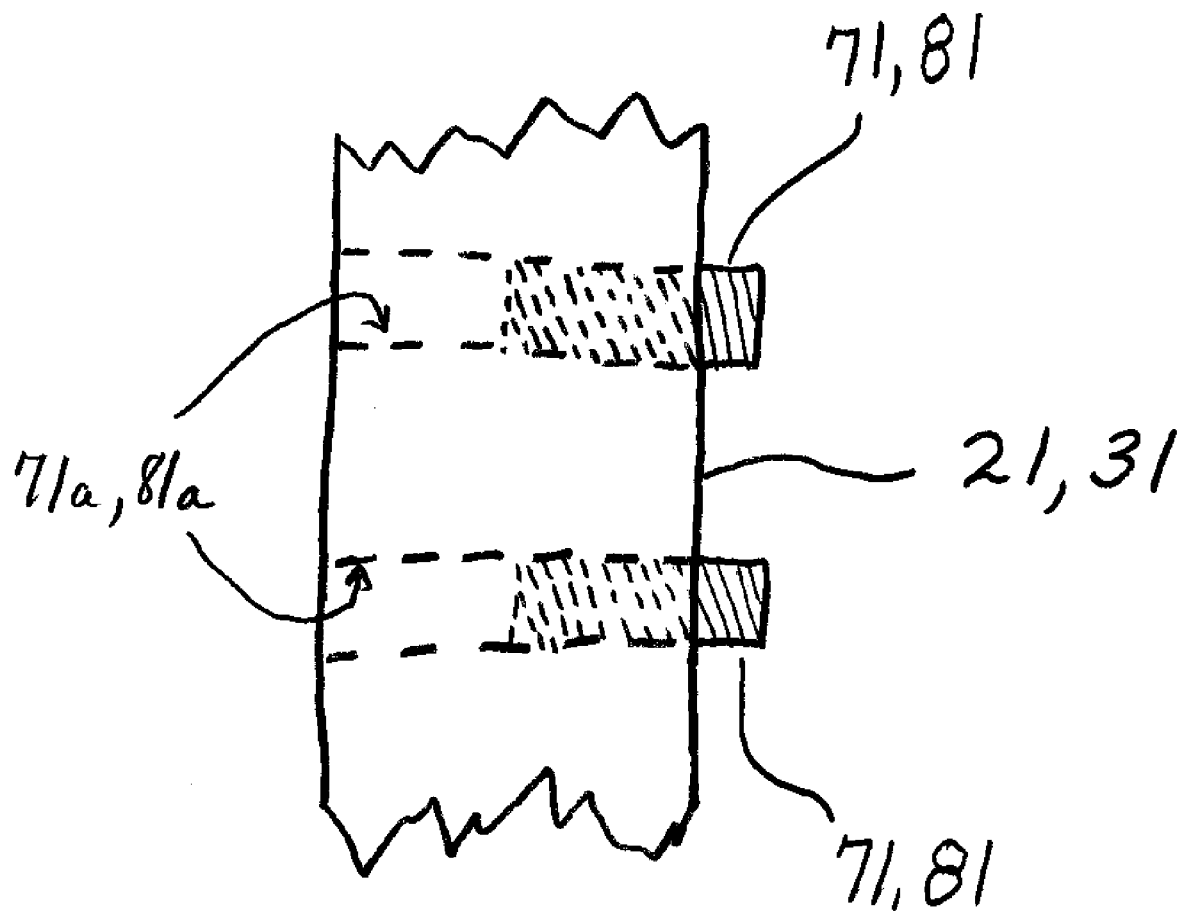
FIG. 8 shows an embodiment of the invention in which the adjusting bars are in the form of screws that can be driven through an internal thread formed in the retaining means.

In accordance with another embodiment of the present invention illustrated schematically in FIG. 8, the magnetic field adjusting device of the present invention has the similar structure to the embodiment illustrated in FIGS. 1, 5 and 6, except in that the adjusting bars 71, 81 are in the form of screws, which can be driven in an internal thread 71a, 81a formed in the press plate 21 or pole plate 31, which serve as retaining means. The screws are thereby mounted and retained on the base in an appropriate manner.

The magnetic field adjusting device of the present invention can also have other variations, for example: the adjusting bars can be only arranged at the periphery of one of the lower pole plate 31 and the lower press plate 21. In addition, said adjusting bars 71, 81 can be dismounted and replaced with adjusting bars of different sizes, or different magnetic properties, to provide the required field adjusting effect.

Figure 7:
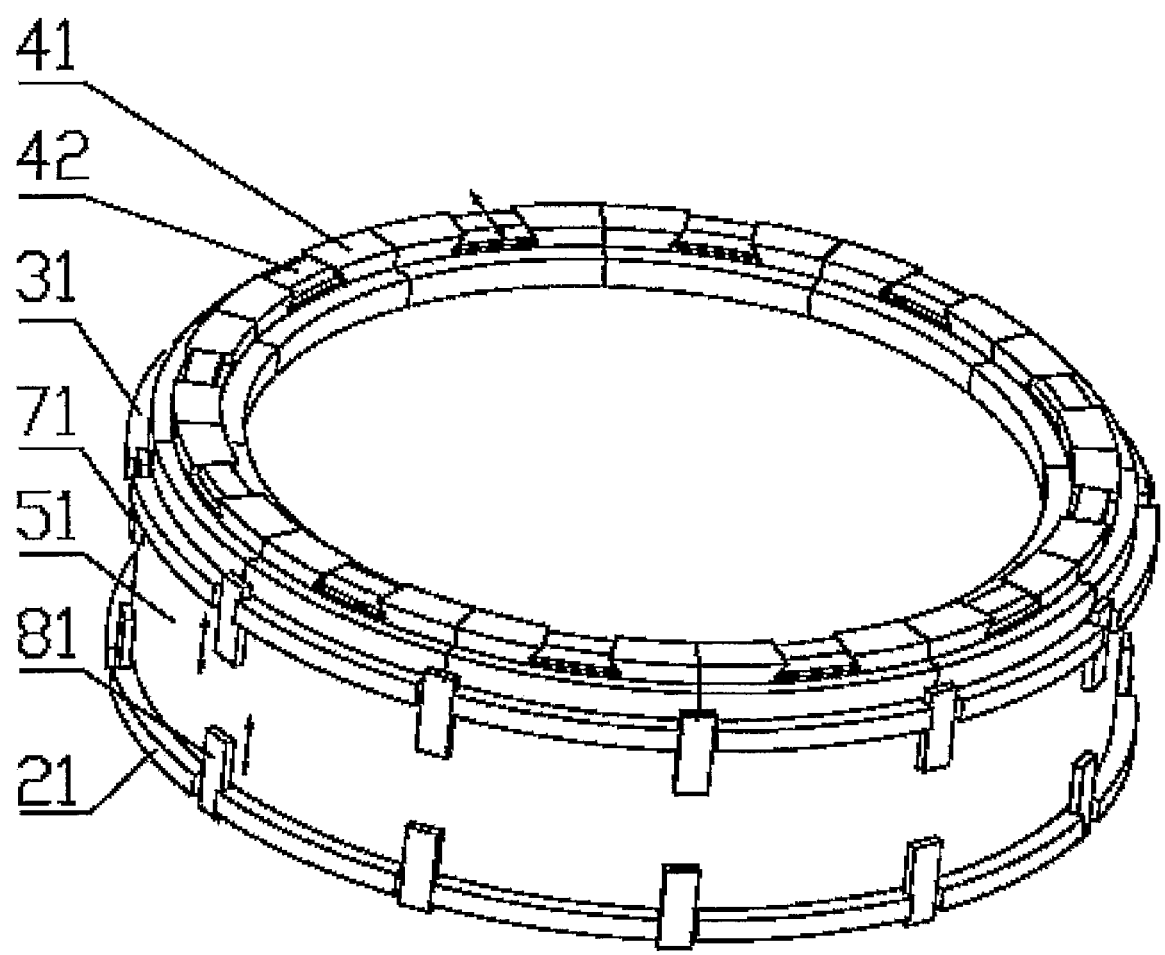
FIG. 7 is an isometric view of still another alternative embodiment, wherein the devices of FIGS. 4A and 6 are used together.

FIG. 7 illustrates another embodiment of the present invention; both of the adjusting devices shown in FIGS. 3 and 4A and in FIGS. 5 and 6 are employed in a same magnetic field adjusting device to increase the effect of field adjustment. Since the structures of both of the adjusting devices have been described above, the detail description will not be repeated again.

While the present invention has been described with respect to a limited number of embodiments, given by way of examples, numerous modifications and variations may be made to the magnetic field adjusting device, within the scope of the invention as defined in the appended claims, for example The magnetic field sources which are provided with magnetic field adjusting devices according to the present invention may be permanent magnets, resistive magnets or superconductive magnets.

The opposing magnetic field sources are preferably oppositely polarized, so as to provide a linear magnetic field between them.

The pole face surfaces are preferably, although not necessarily, parallel to one another to provide a uniform field.

The magnetic field adjusting device is particularly useful for increasing the homogeneity of magnetic fields used for MRI or Nuclear Magnetic Resonance imaging, by allowing easy and accurate shimming of the magnetic field when the apparatus is installed. The present invention may of course be applied to the adjustment of magnetic fields in other applications.

Figure 9:
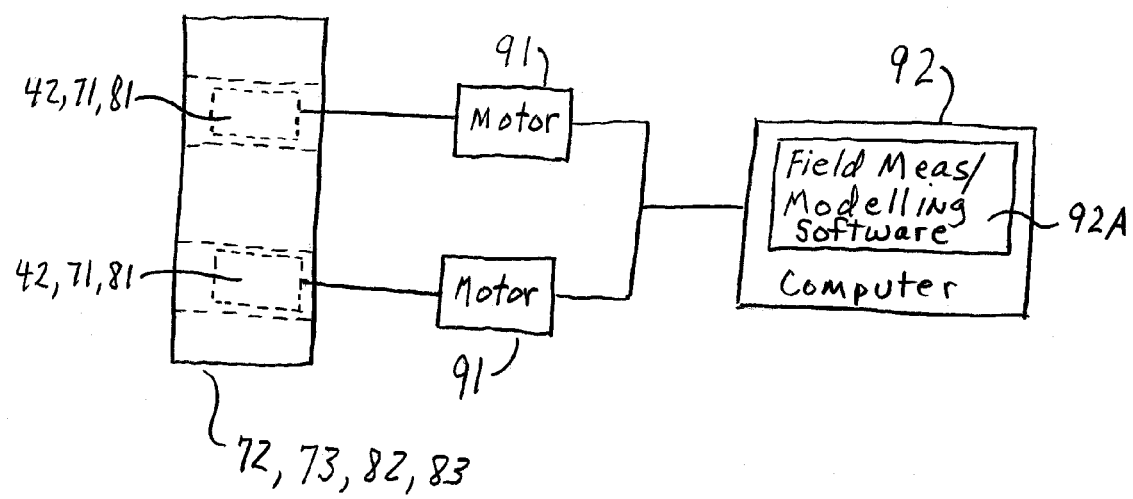
FIG. 9. shows an embodiment of the invention in which the shimming plugs or adjusting bars are driven by electric motors under the control of a computer.

The drive means may be arranged to be driven manually, or may be remotely driven by appropriately controlled electric motors. In a particularly advantageous embodiment, such electric motors may be controlled by a computer operating a magnetic field measuring and modeling software to automatically shim the magnet for optimum homogeneity. Thus, in the embodiment illustrated schematically in FIG. 9, for example, the shimming plugs or adjusting bars 42, 71 or 81 may be adjusted by one or more electric motors 91, which in turn may be controlled by a computer 92 that is programmed with magnetic field measurement and/or modeling software 92A. The computer thus controls the electric motors 91 to adjust the shimming plugs or adjusting bars 42, 71 or 81 automatically in response to measured or modeled magnetic field data, to achieve a desired level of field homogeneity. That is, the shimming plugs or adjusting bars may be adjusted in a synchronized manner.

Since the shimming plugs and adjusting bars of the present invention are driven and retained by rotary screw or gear mechanisms, it is very simple to displace the plug or bar by a required amount, to return the plug or bar to an original position, simply by noting the angular displacement applied to the rotary screw or gear mechanism.

The invention claimed is:

1. A magnetic field generation source comprising:
    a yoke, connected with an upper press plate and a lower press plate, the lower press plate and the upper press plate being oppositely arranged; and
    a pair of magnetic field generating sources and pole plates that are oppositely mounted on the respective press plates and are arranged to generate a magnetic field between them; wherein
    each of said magnetic field generating sources includes a magnetic field adjusting device;
    the magnetic field adjusting device comprises adjusting bars of a soft magnetic material mounted at the periphery of the magnetic field generating source;
    the installed position of adjusting bars when mounted at the periphery of the magnetic field generating source is moveable in a direction substantially parallel to a magnetic field produced by the magnetic field generating source;
    the resulting magnetic field generated by the magnetic field generating source is adjusted as a function of the installed position of the bars; and
    said adjusting bars have a rack structure, and are arranged to be driven by means of mating pinion gears.

2. The magnetic field generating source according to claim 1, wherein the adjusting bars are moveable in a direction perpendicular to the pole plate.

3. The magnetic field generating source according to claim 1, wherein said adjusting bars are mounted movably in retaining means.

4. The magnetic field adjusting source according to claim 1, wherein said adjusting bars are dismountable for replacement with adjusting bars of different size or different magnetic properties.

5. The magnetic field generating source of claim 1, wherein the shimming plugs or adjusting bars are arranged for adjustment in a synchronized manner.

6. The magnetic field generating source of claim 1, wherein the shimming plugs or adjusting bars are arranged for remote adjustment by one or more electric motors.

7. The magnetic field generating source of claim 1, further comprising a computer programmed with magnetic field measurement and/or modeling software, the computer being arranged to control the electric motors to adjust the shimming plugs or adjusting bars in accordance with instructions provided in response to magnetic field measurement or modeling.

8. The magnetic field generating source according to claim 1, wherein the computer is arranged to control the electric motors to automatically adjust the shimming plugs or adjusting bars to achieve a desired level of field homogeneity.

9. MRI apparatus comprising a magnetic field generation device according to claim 1.

* * * * *